(12) United States Patent
Che

(10) Patent No.: US 11,780,727 B2
(45) Date of Patent: Oct. 10, 2023

(54) LOW-STRESS PACKAGING STRUCTURE FOR MEMS ACCELERATION SENSOR CHIP

(71) Applicant: ZHEJIANG UNIVERSITY, Zhejiang (CN)

(72) Inventor: Lufeng Che, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 254 days.

(21) Appl. No.: 17/295,598

(22) PCT Filed: Jan. 12, 2021

(86) PCT No.: PCT/CN2021/071306
§ 371 (c)(1),
(2) Date: May 20, 2021

(87) PCT Pub. No.: WO2022/062279
PCT Pub. Date: Mar. 31, 2022

(65) Prior Publication Data
US 2022/0306458 A1    Sep. 29, 2022

(30) Foreign Application Priority Data

Sep. 22, 2020  (CN) .......................... 202011001239.2

(51) Int. Cl.
*B81B 7/00* (2006.01)
*G01P 1/02* (2006.01)
(Continued)

(52) U.S. Cl.
CPC .......... *B81B 7/0048* (2013.01); *B81B 7/0045* (2013.01); *B81B 7/02* (2013.01);
(Continued)

(58) Field of Classification Search
CPC . G01P 1/02; G01P 1/023; G01P 15/18; B81B 7/0048; B81B 7/0054; B81B 7/0045; B81C 1/00325; B81C 1/00238
See application file for complete search history.

(56) References Cited

U.S. PATENT DOCUMENTS

2004/0119143 A1*  6/2004  Karpman ................ G01P 1/023
                                                    257/618
2006/0097331 A1*  5/2006  Hattori ............... G01C 19/5719
                                                    257/414
(Continued)

FOREIGN PATENT DOCUMENTS

CN    203238029 U    10/2013
CN    106744644 A     5/2017
(Continued)

OTHER PUBLICATIONS

WIPO, International Search Report issued in PCT Application No. PCT/CN2021/071306, dated Jun. 29, 2021.

*Primary Examiner* — Helen C Kwok
(74) *Attorney, Agent, or Firm* — Hodgson Russ LLP

(57) ABSTRACT

A low-stress packaging structure for a MEMS acceleration sensor chip includes a MEMS sensor chip and a chip carrier. Two sides of the bottom of the sensor chip are provided with a first metal layer and a second metal layer respectively. Two sides of a die attach area of the chip carrier are correspondingly provided with a third metal layer and a fourth metal layer. The first metal layer of the sensor chip and the third metal layer of the chip carrier are bonded together. The second metal layer of the sensor chip and the fourth metal layer of the chip carrier are only in contact but not bonded. A groove is arranged between the first metal layer and the second metal layer at the bottom of the sensor chip. A certain gap is defined between the sensor chip and cavity walls of chip carrier.

19 Claims, 4 Drawing Sheets

(51) Int. Cl.
  *B81B 7/02* (2006.01)
  *B81C 1/00* (2006.01)
  *G01P 15/125* (2006.01)
(52) U.S. Cl.
  CPC ......... *B81C 1/00325* (2013.01); *G01P 1/023* (2013.01); *G01P 15/125* (2013.01); *B81B 2201/0235* (2013.01)

(56) References Cited

U.S. PATENT DOCUMENTS

| | | | | |
|---|---|---|---|---|
| 2007/0117275 A1* | 5/2007 | DCamp | ............... | B81C 1/00285 438/127 |
| 2007/0158826 A1* | 7/2007 | Sakakibara | ........... | B81B 7/0064 257/723 |
| 2008/0066546 A1* | 3/2008 | Katsumata | ........... | G01P 15/125 73/504.12 |
| 2008/0315397 A1* | 12/2008 | Eskridge | ............... | B81B 7/0048 257/693 |
| 2009/0241668 A1* | 10/2009 | Jang | ...................... | G01P 15/123 73/514.32 |
| 2011/0298064 A1* | 12/2011 | Pahl | ...................... | B81C 1/0023 438/51 |
| 2013/0307094 A1* | 11/2013 | Yoshiuchi | ............... | H01L 29/84 257/415 |
| 2013/0341737 A1* | 12/2013 | Bryzek | ................. | B81B 7/0051 438/51 |
| 2017/0057810 A1* | 3/2017 | Murali | .................. | B81B 7/0087 |
| 2017/0088416 A1* | 3/2017 | Tocchio | .................. | H01L 23/13 |

FOREIGN PATENT DOCUMENTS

| | | |
|---|---|---|
| CN | 211238214 U | 8/2020 |
| CN | 112158792 A | 1/2021 |

* cited by examiner

LOW-STRESS PACKAGING STRUCTURE FOR MEMS ACCELERATION SENSOR CHIP

CROSS-REFERENCE TO RELATED APPLICATION

This application is a national phase entry under 35 USC § 371 of PCT International Application No. PCT/CN2021/071306, filed on Jan. 12, 2021, which claims priority to Chinese Patent Application Serial No. 202011001239.2, filed on Sep. 22, 2020, the entire contents of which are incorporated by reference herein.

FIELD

The present disclosure relates to low-stress packaging structures for sensor chips, and more particularly to low-stress packaging structures suitable for MEMS (Micro-Electro-Mechanical Systems) acceleration sensor chips, which belongs to the field of sensor packaging technology.

BACKGROUND

MEMS acceleration sensors as representative micro sensors have been widely used in consumer electronics, oil-gas exploration, aeronautics and astronautics, and other fields, as MEMS technology benefits from small volume, light weight, easy integration, low cost, reduced power consumption, and easy mass-production. However, chip packaging is one of the key steps in the production process of the acceleration sensors, which not only accounts for 30%-40% of the total cost but also plays a crucial role as a bridge between a sensor chip and an external processing circuit. Through packaging, the acceleration sensor chip can establish an electrical connection with the outside, and obtain mechanical support, thereby preventing damage and interference from harmful factors such as external force, heat, chemistry and the like.

In the traditional packaging, a bottom surface of the acceleration sensor chip simply adheres to the die attach area of the chip carrier by gluing or soldering, then the sensor chip and the chip carrier are wire-bonded, and finally a cap is used to seal the die attach cavity. When the external temperature changes, the bonding material, the package material, and the chip material will reflect different deformations due to the disagreement over thermal expansion coefficients of three materials, thereby causing thermal stress. The stress is transmitted to an interior of the acceleration sensor chip through a bottom layer of the chip, causing deformation of an elastic beam of the sensor and offset of a moveable proof mass, which will eventually affect the performance of the sensor, such as sensitivity, zero offset, and temperature coefficient. Therefore, how to reduce the thermal stress introduced by the packaging process is extremely important for the development of high-performance MEMS acceleration sensors.

SUMMARY

In one aspect, the present disclosure provides a low-stress packaging structure suitable for MEMS acceleration sensor chips. The low-stress packaging structure includes a MEMS acceleration sensor chip, wherein two sides of the bottom of the MEMS acceleration sensor chip are provided with a first metal layer and a second metal layer respectively, and a groove is arranged between the first metal layer and the second metal layer; and a chip carrier, wherein two sides of a die attach area of the chip carrier are correspondingly provided with a third metal layer and a fourth metal layer.

In another aspect, the present disclosure provides a semiconductor package that includes a MEMS acceleration sensor chip and a chip carrier. The MEMS acceleration sensor chip is provided with a first metal layer and a second metal at the bottom of the MEMS acceleration sensor chip and along a first direction, and a groove is arranged between the first metal layer and the second metal layer. The chip carrier is provided with a third metal layer and a fourth metal layer on the die attach area of the chip carrier and along the first direction. The third metal layer and the first metal layer are arranged oppositely, and the fourth metal layer and the second metal layer are arranged oppositely.

The above description is only an overview of technical solutions of the present disclosure. In order to understand the technical means of the present disclosure more clearly and implement them in accordance with the content of the description, embodiments of the present disclosure will be described below in conjunction with the drawings.

DETAILED DESCRIPTION

Figure 1:
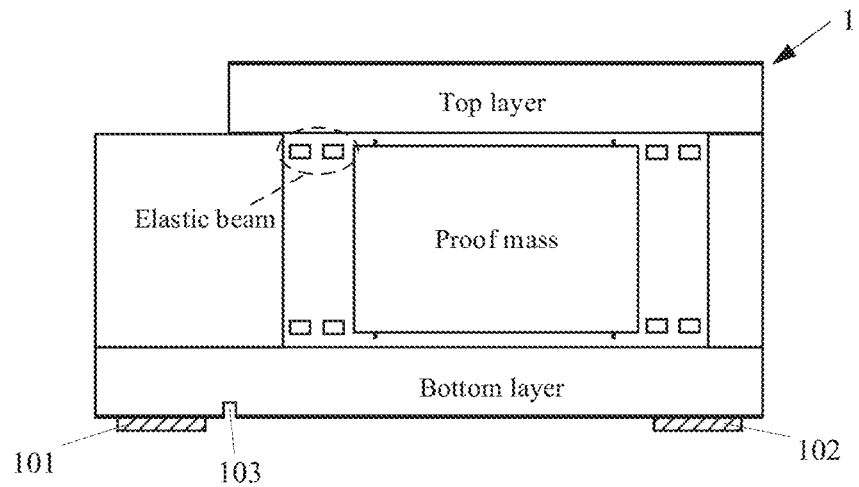
FIG. 1 is a schematic view of a MEMS acceleration sensor chip as an embodiment of the present disclosure.

The present disclosure will be further described in detail below in combination with the drawings. Examples of the embodiments will be illustrated in the drawings, in which, the same or similar elements and the elements having same or similar functions are denoted by like reference numerals throughout the description. The following embodiments are only used to describe the technical solutions of the present disclosure more clearly, and shall not be construed to limiting the protection scope of the present disclosure.

In order to reduce packaging thermal stress, the related art usually take measures from the following perspectives. The first method is to select a packaging material. In the light of structural characteristics of the sensor chip, low-stress film adhesives can be selected to effectively buffer external stress. The second method is to optimize the structure of the chip. On the one hand, the thickness of the bottom layer of a MEMS chip is appropriately increased to reduce the influence of the external stress on deformation of a moveable proof mass of the chip; on the other hand, a stress isolation structure is introduced. Although the second method can effectively reduce the packaging stress, it requires the production of additional structure layers, which increases the process complexity and is not conducive to miniaturization. The third method is to design a bonding position and a bonding area of the chip. During packaging, the position where the external stress has little effect on the structure deformation of the sensor can be selected for bonding, and the bonding area can be minimized without affecting the impact resistance.

A structure of a MEMS acceleration sensor chip 1 as an embodiment of the present disclosure is illustrated in FIG. 1. The MEMS acceleration sensor chip 1 uses the capacitive detection principle. A proof mass acts as a movable electrode, and a top layer and a bottom layer act as two fixed electrodes. The movable electrode and two fixed electrodes represent a pair of differential capacitors. Deformation of the elastic beam and movement of the proof mass can change the differential capacitance between the mass and the two fixed electrodes when acceleration comes along sensing direction, and the amount of change in the differential capacitance is converted into a voltage signal by the detection circuit to characterize the acceleration input from the outside. When the packaging thermal stress is introduced into the sensor through the bottom layer, sensitive structures of the MEMS acceleration sensor chip, such as the elastic beam, deforms. This undesirable phenomenon will result in the torsion of the proof mass and the change in capacitor gaps, and ultimately affecting the performance of the acceleration sensor.

A low-stress packaging structure suitable for a MEMS acceleration sensor chip involved in the present disclosure includes a MEMS acceleration sensor chip 1 and a chip carrier 2.

Figure 2:
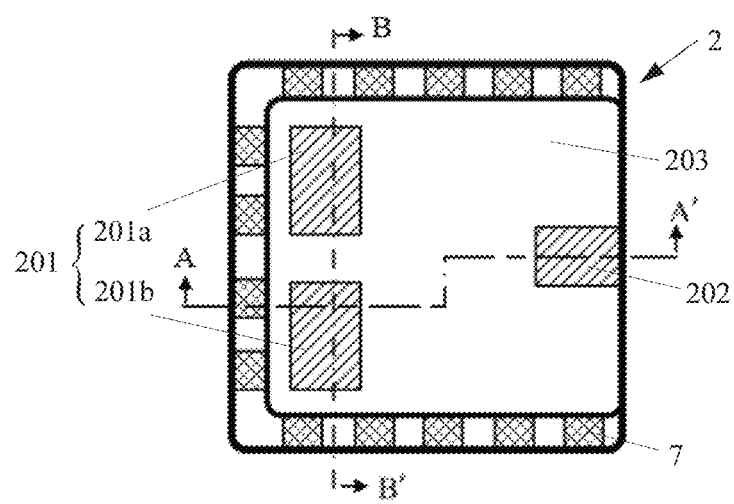
FIG. 2 is a top view of a chip carrier for a MEMS acceleration sensor chip involved in the present disclosure.

The MEMS acceleration sensor chip 1 is provided with a first metal layer 101, a second metal layer 102, and a groove 103 on two sides of the bottom of the acceleration sensor chip 1, in which, the groove 103 is arranged between the first metal layer 101 and the second metal layer 102 and close to the first metal layer 101. The chip carrier 2 for the MEMS acceleration sensor chip 1 is illustrated in FIG. 2. Two sides of a die attach area 203 of the chip carrier 2 are also provided with a third metal layer 201 and a fourth metal layer 202 respectively, in which the third metal layer 201 is composed of a third metal sub-layer 201a and a third metal sub-layer 201b adjacent to each other.

The first metal layer 101 and the second metal layer 102 are made of Ti/Au, while the third metal layer 201 and the fourth metal layer 202 are made of Ni/Au.

Figure 3:
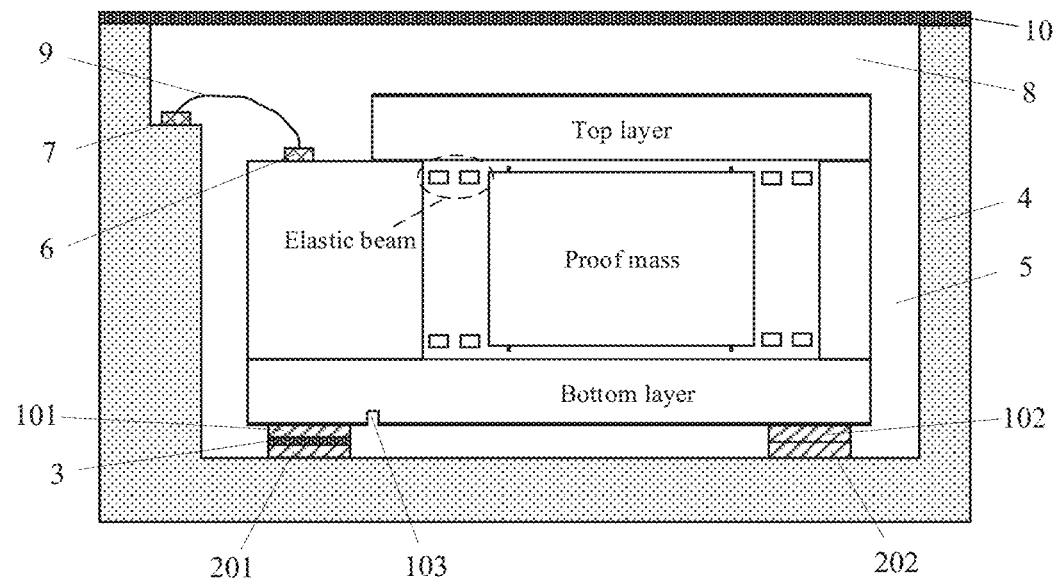
FIG. 3 is a sectional view of a packaging structure for a MEMS acceleration sensor chip involved in the present disclosure along a line A-A' in FIG. 2.
Figure 4:
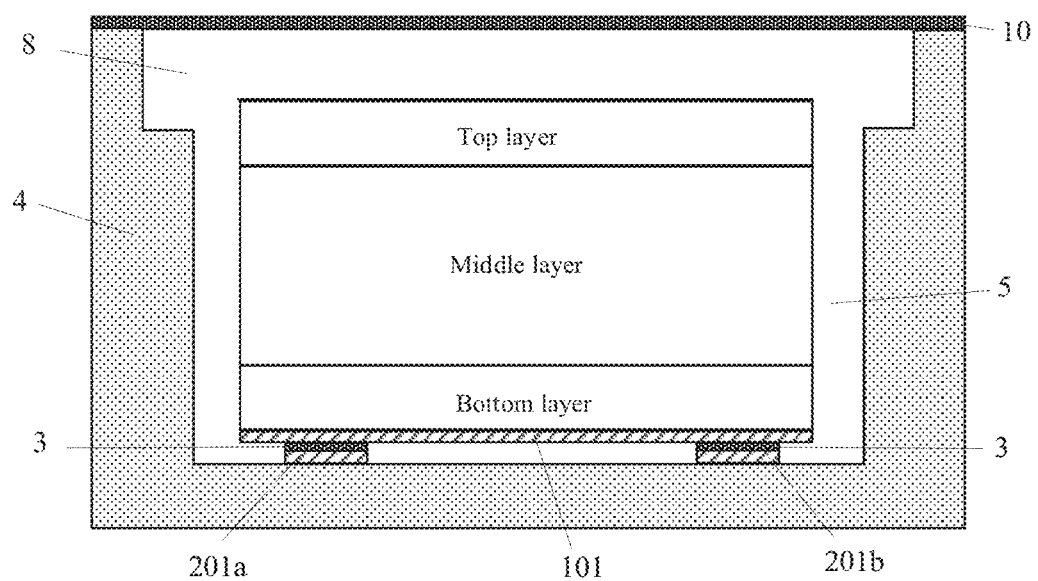
FIG. 4 is a sectional view of a packaging structure for a MEMS acceleration sensor chip involved in the present disclosure along a line B-B' in FIG. 2.
Figure 5:
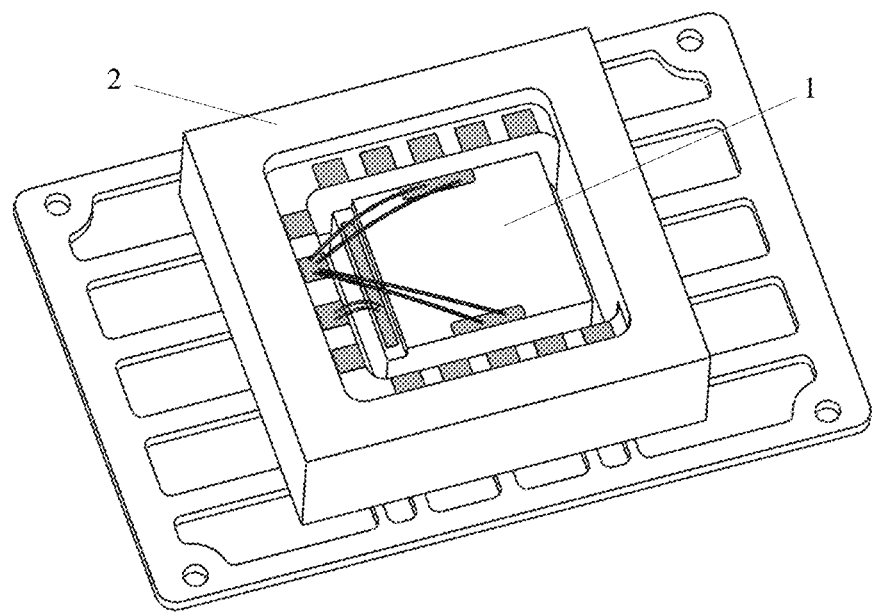
FIG. 5 is a three-dimensional view of a MEMS acceleration sensor chip involved in the present disclosure and packaged in a chip carrier.

A sectional view of the low-stress packaging structure for the MEMS acceleration sensor chip involved in the present disclosure can refer to FIGS. 3 and 4. A three-dimensional view of the MEMS acceleration sensor chip involved in the present disclosure and packaged in the chip carrier can refer to FIG. 5.

The first metal layer 101 of the MEMS acceleration sensor chip and the third metal layer 201 of the chip carrier 2 are bonded together by a gold-tin solder layer 3, and the second metal layer 102 and the fourth metal layer 202 are only in contact but not bonded. Since only one side of the MEMS sensor chip 1 is integrally packaged with the chip carrier 2 by bonding, and the other side of the MEMS sensor chip 1 is in a free state, the packaging stress can be released sufficiently by movement of the free end, and the packaging stress on the chip 1 can be reduced effectively.

The second metal layer 102 at the bottom of the MEMS acceleration sensor chip 1 and the fourth metal layer 202 on the die attach area 203 of the chip carrier 2 are only in contact but not bonded, which can provide mechanical support for the chip 1. Compared with an isolated boss structure in the related art, the low-stress packaging structure has higher reliability and superior impact-resistance.

In order to prevent the gold-tin solder from overflowing to the other side of the bottom of the MEMS sensor chip 1 during high-temperature packaging, and from causing the second metal layer 102 to be bonded with the fourth metal layer 202, the groove 103 is arranged on a side of the bottom of the MEMS sensor chip 1 where the first metal layer 101 is arranged.

The groove 103 has a width of not smaller than 100 μm, and a depth of not smaller than 10 μm.

There is an expansion gap 5 between the MEMS acceleration sensor chip 1 and cavity walls 4 of the chip carrier, which can ensure a certain space margin for the expansion of the material of the MEMS acceleration sensor chip 1 during high-temperature packaging, so that the packaging stress of the MEMS acceleration sensor chip 1 can be minimized.

In order to remain a sufficient margin of motion space, the expansion gap 5 has a width of not smaller than 0.1 mm.

Bonding pads 6 on the MEMS acceleration sensor chip 1 and bonding pads 7 in the die attach cavity 8 of the chip carrier 2 are connected to each other via metal leads 9 to realize mutual transmission of electrical signals inside and outside the chip carrier 2, and finally a metal cap 10 is used for vacuum sealing of the die attach cavity 8 of the chip carrier 2. In such a way, the low-stress packaging of the MEMS acceleration sensor chip 1 is completed.

In some embodiments, in order to reduce impact of the chip carrier 2 on the thermal stress on the sensor chip 1, the chip carrier 2 is made of a ceramic material with good thermal conductivity and a low thermal expansion coefficient, such as aluminum oxide ceramics. The material of the metal cap 10 is a sealing alloy whose thermal expansion coefficient is approximate to that of the ceramic carrier 2, such as iron-nickel alloy, iron-nickel-cobalt alloy, iron-nickel-chromium alloy, iron-chromium alloy, iron-nickel-copper alloy, nickel-molybdenum alloy, nickel-molybdenum-tungsten alloy, and etc.

Figure 6:
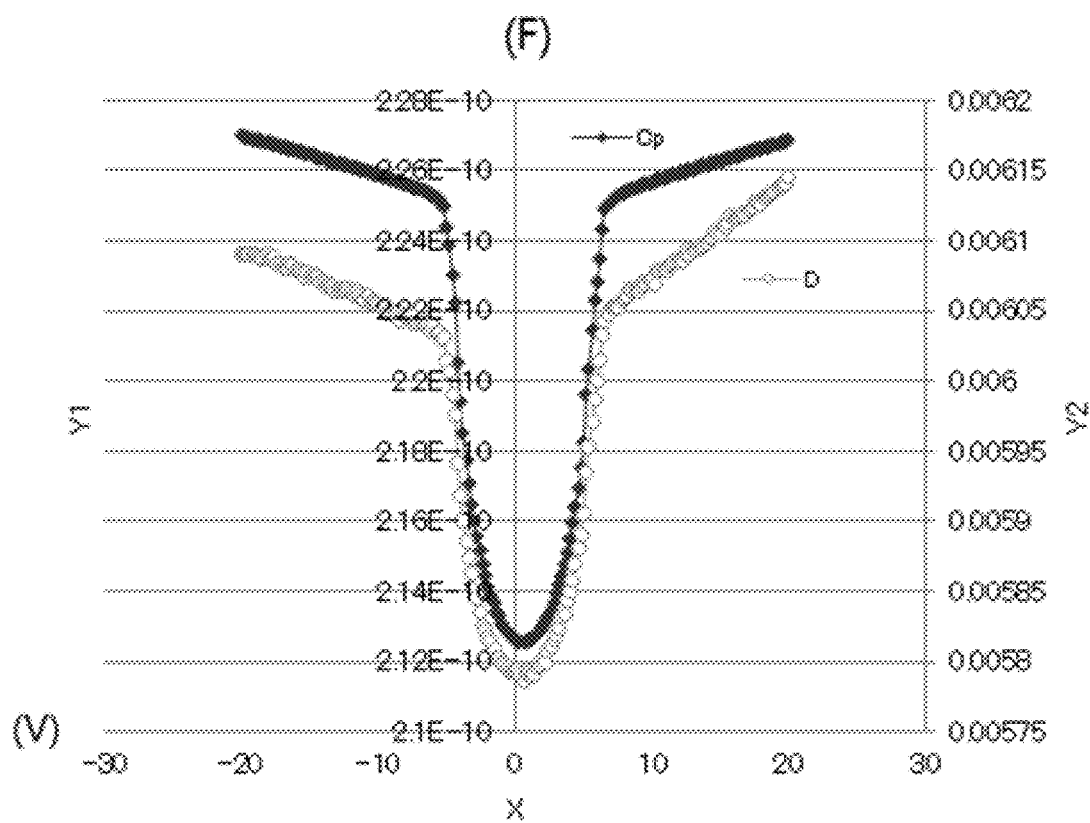
FIG. 6 is a CV curve (capacitance-voltage relation curve) of a capacitor constituted by the top layer and proof mass after low-stress packaging of a MEMS acceleration sensor chip involved in the present disclosure is completed.
Figure 7:
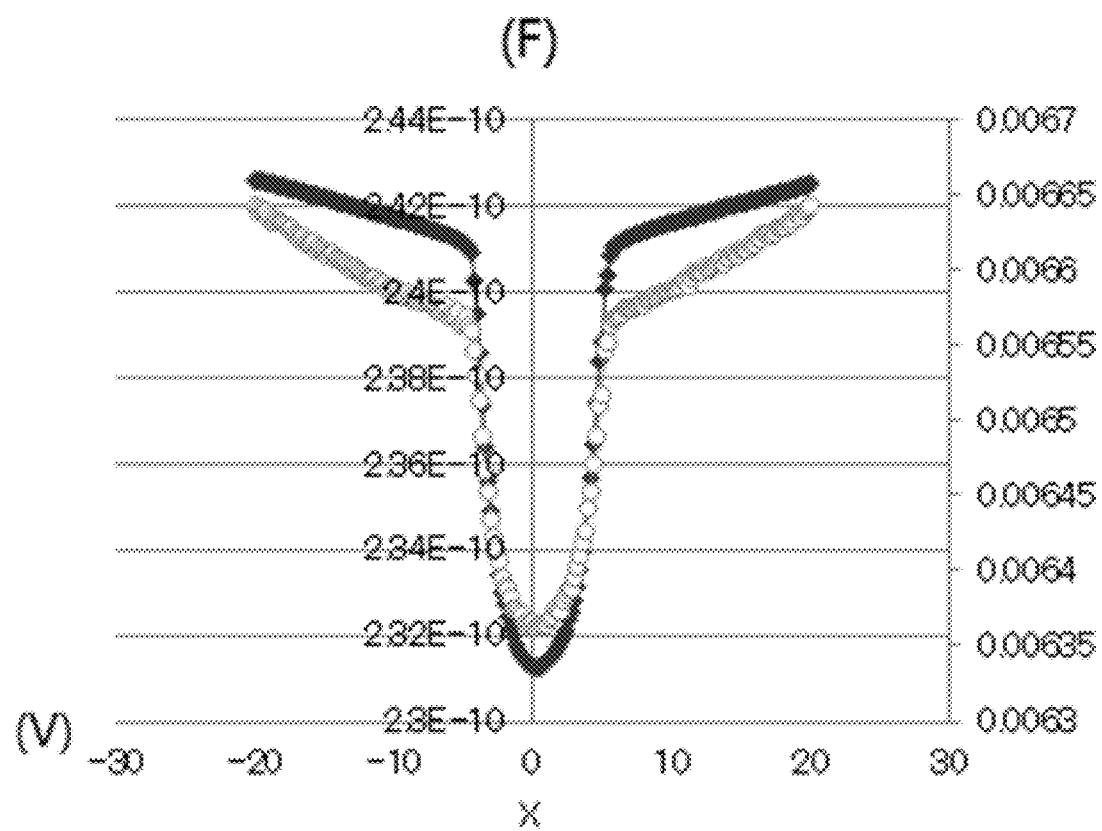
FIG. 7 is a CV curve (capacitance-voltage relation curve) of a capacitor constituted by the bottom layer and proof mass after low-stress packaging of a MEMS acceleration sensor chip involved in the present disclosure is completed.

After the low-stress packaging of the MEMS acceleration sensor chip 1 involved in the present disclosure is completed, a CV curve (capacitance-voltage curve) of a capacitor constituted by the top layer and the proof mass can be seen in FIG. 6, and a CV curve of a capacitor constituted by the bottom layer and the proof mass can be seen in FIG. 7. Through calculation and analysis on the CV curve, the offset angle of the proof mass is 3.783E-4 degree, and the mass center displacement is 0.032 micron, so it can be seen that the offset angle and the mass center displacement of the proof mass caused by the packaging stress are considerably reduced.

The present disclosure at least has the following beneficial effects.

Since only one side of the MEMS sensor chip is integrally packaged with the chip carrier by bonding and the other side thereof is in the free state, the packaging stress can be released sufficiently by movement of the free end, thereby effectively reducing the thermal stress introduced during packaging process.

The metal layers on the die attach area of the chip carrier and the bottom of the MEMS acceleration sensor chip, which are only in contact but not bonded, can provide mechanical support for the chip, thereby enhancing impact-resistance and reliability of the packaging structure.

There is an expansion gap between the MEMS acceleration sensor chip and cavity walls of the chip carrier, so it can be ensured that the material of the chip has a certain margin of the expansion space during high-temperature packaging, and the packaging stress of the sensor can be minimized.

In the description of the present disclosure, it should be understood that terms such as "upper," "lower," "vertical," "horizontal," "top," "bottom," "inner," "outer," and the like should be constructed to refer to the orientation or position as then described or as shown in the drawings under discussion. These terms are for convenience and simplification of description and do not indicate or imply that the device or element referred to must have a particular orientation, or be constructed and operated in a particular orientation, so these terms shall not be construed to limit the present disclosure.

In addition, terms such as "first" and "second" are only used for description, and cannot be construed to indicate and imply relative importance.

In the description of the present disclosure, it should be understood that unless specified or limited otherwise, terms "mounted," "connected," and "coupled" are used broadly, and may be, for example, fixed connections, integral connections, or detachable connections; may also be mechanical or electrical connections; may be inner communications of two elements; may also be direct connections or indirect connections via intervening structures, which can be understood by those skilled in the art according to specific situations.

Apparently, the above description is not intended to limit the present disclosure, and the present disclosure is not limited to the above examples. Various changes, modifications, additions, or alternatives made by those skilled in the related art within the essential scope of the present disclosure shall also belong to the protection scope of the present disclosure.

What is claimed is:

1. A low-stress packaging structure, comprising:
   a MEMS acceleration sensor chip, wherein two sides of the bottom of the MEMS acceleration sensor chip are provided with a first metal layer and a second metal layer respectively, and a groove is arranged between the first metal layer and the second metal layer and close to the first metal layer; and
   a chip carrier, wherein two sides of a die attach area of the chip carrier are correspondingly provided with a third metal layer and a fourth metal layer,
   wherein the first metal layer of the MEMS acceleration sensor chip and the third metal layer of the chip carrier are bonded together, and the second metal layer and the fourth metal layer are only in contact but not bonded.

2. The low-stress packaging structure according to claim 1, wherein the third metal layer is composed of two adjacent third metal sub-layers.

3. The low-stress packaging structure according to claim 1, wherein the first metal layer and the second metal layer are made of titanium/gold, while the third metal layer and the fourth metal layer are made of nickel/gold.

4. The low-stress packaging structure according to claim 1, wherein the groove has a width of not smaller than 100 µm, and a depth of not smaller than 10 µm.

5. The low-stress packaging structure according to claim 1, wherein an expansion gap is defined between the MEMS acceleration sensor chip and cavity walls of the chip carrier.

6. The low-stress packaging structure according to claim 5, wherein the first metal layer of the MEMS acceleration sensor chip and the third metal layer of the chip carrier are bonded together by a gold-tin solder layer.

7. The low-stress packaging structure according to claim 5, wherein the expansion gap has a width of not smaller than 0.1 mm.

8. The low-stress packaging structure according to claim 1, wherein bonding pads on the MEMS acceleration sensor chip and bonding pads in the die attach area of the chip carrier are connected to each other via metal leads.

9. The low-stress packaging structure according to claim 1, further comprising a metal cap configured to seal the die attach area of the chip carrier.

10. A semiconductor package, comprising:
    a MEMS acceleration sensor chip provided with a first metal layer and a second metal at the bottom of the MEMS acceleration sensor chip and along a first direction, a groove being arranged between the first metal layer and the second metal layer and close to the first metal layer; and
    a chip carrier provided with a third metal layer and a fourth metal layer on a die attach area of the chip carrier and along the first direction,
    wherein the third metal layer and the first metal layer are arranged oppositely, the fourth metal layer and the second metal layer are arranged oppositely, the first metal layer and the third metal layer are bonded together, and the second metal layer and the fourth metal layer are only in contact but not bonded.

11. The semiconductor package according to claim 10, wherein two adjacent first metal sub-layers are arranged at the bottom of the MEMS acceleration sensor chip along a second direction, and two adjacent third metal sub-layers are arranged on the die attach area of the chip carrier along the second direction, the second direction being perpendicular to the first direction.

12. The semiconductor package according to claim 10, wherein one first metal layer is arranged at the bottom of the MEMS acceleration sensor chip along a second direction, and two adjacent third metal sub-layers are arranged on the die attach area of the chip carrier along the second direction, the second direction being perpendicular to the first direction.

13. The semiconductor package according to claim 10, wherein the first metal layer and the second metal layer are made of titanium/gold, while the third metal layer and the fourth metal layer are made of nickel/gold.

14. The semiconductor package according to claim 10, wherein the groove has a width of not smaller than 100 µm, and a depth of not smaller than 10 µm.

15. The semiconductor package according to claim 10, wherein a gap is defined between a periphery of the MEMS acceleration sensor chip and cavity walls of the chip carrier.

16. The semiconductor package according to claim 15, wherein the first metal layer and the third metal layer are bonded together by a gold-tin solder layer.

17. The semiconductor package according to claim 15, wherein the gap has a width of not smaller than 0.1 mm.

18. The semiconductor package according to claim 10, wherein bonding pads on the MEMS acceleration sensor chip and bonding pads in the die attach area of the chip carrier are connected to each other via metal leads.

19. The semiconductor package according to claim 10, further comprising a metal cap configured to seal the die attach area of the chip carrier.

* * * * *